United States Patent
Huang et al.

(10) Patent No.: US 8,652,951 B2
(45) Date of Patent: Feb. 18, 2014

(54) SELECTIVE EPITAXIAL GERMANIUM GROWTH ON SILICON-TRENCH FILL AND IN SITU DOPING

(71) Applicant: Applied Materials, Inc., Santa Clara, CA (US)

(72) Inventors: Yi-Chiau Huang, Fremont, CA (US); Jiping Li, Palo Alto, CA (US); Miao Jin, San Jose, CA (US); Bingxi Sun Wood, Cupertino, CA (US); Errol Antonio C. Sanchez, Tracy, CA (US); Yihwan Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/765,733

(22) Filed: Feb. 13, 2013

(65) Prior Publication Data
US 2013/0210221 A1 Aug. 15, 2013

Related U.S. Application Data

(60) Provisional application No. 61/598,166, filed on Feb. 13, 2012.

(51) Int. Cl.
*H01L 21/20* (2006.01)

(52) U.S. Cl.
USPC .......................................................... 438/509

(58) Field of Classification Search
None
See application file for complete search history.

(56) References Cited

U.S. PATENT DOCUMENTS

| | | | |
|---|---|---|---|
| 5,897,370 A * | 4/1999 | Joshi et al. ............... | 438/632 |
| 2007/0032026 A1 * | 2/2007 | Ong et al. ................ | 438/301 |
| 2007/0231976 A1 * | 10/2007 | Kang et al. .............. | 438/151 |
| 2010/0151619 A1 * | 6/2010 | Yasaitis et al. .......... | 438/93 |
| 2011/0049568 A1 * | 3/2011 | Lochtefeld et al. ..... | 257/190 |

* cited by examiner

*Primary Examiner* — Scott B Geyer
(74) *Attorney, Agent, or Firm* — Patterson & Sheridan, LLP

(57) ABSTRACT

Methods and apparatus for forming a germanium containing film on a patterned substrate are described. The patterned substrate is a silicon, or silicon containing material, and may have a mask material formed on a surface thereof. The germanium containing material is formed selectively on exposed silicon in the recesses of the substrate, and an overburden of at least 50% is formed on the substrate. The germanium containing layer is thermally treated using pulsed laser radiation, which melts a portion of the overburden, but does not melt the germanium containing material in the recesses. The germanium containing material in the recesses is typically annealed, at least in part, by the thermal treatment. The overburden is then removed.

15 Claims, 2 Drawing Sheets

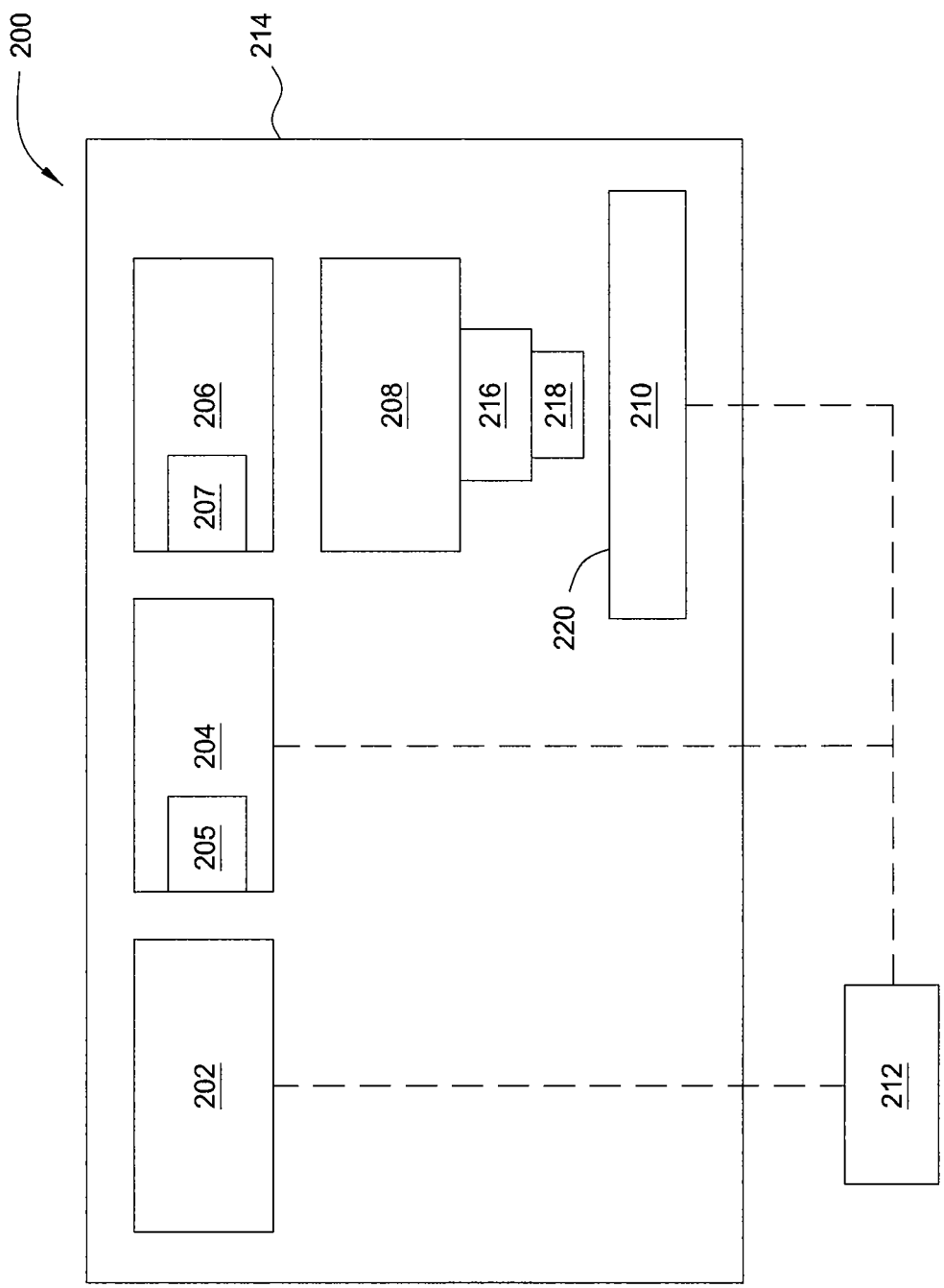

SELECTIVE EPITAXIAL GERMANIUM GROWTH ON SILICON-TRENCH FILL AND IN SITU DOPING

CROSS-REFERENCE TO RELATED APPLICATIONS

This application claims benefit of U.S. provisional patent application Ser. No. 61/598,166, filed Feb. 13, 2012, which is herein incorporated by reference.

FIELD

Embodiments herein generally relate to methods of manufacturing semiconductor substrates. More specifically, this application relates to eiptaxy methods for forming structures on a semiconductor substrate.

BACKGROUND

Germanium is a semiconductor that offers great promise in certain semiconductor devices and structures, most notably for channel materials in advanced metal-oxide-semiconductor field-effect transistors (MOSFETs). When growing germanium on silicon in heteroepitaxial processes, germanium may be selectively grown in trenches of a patterned silicon substrate. Any imperfections in the crystalline germanium, as deposited, may be removed by annealing, which is typically done by a thermal process. In a conventional process, the substrate is heated to an anneal temperature to drive any imperfections or dislocations to the interface between the silicon and the germanium. However, in conventional processes, the thermal treatment frequently results in extrusion of the germanium from the trenches. Therefore, there is a need for an improved process for thermal treatment of silicon-germanium heteroepitaxial structures.

SUMMARY

Methods and apparatus for forming a germanium containing film on a patterned substrate are described. The patterned substrate is a silicon, or silicon containing material, and may have a mask material formed on a surface thereof. The germanium containing material is formed selectively on exposed silicon in the recesses of the substrate, and an overburden of at least 50% is formed on the substrate. The germanium containing layer is thermally treated using pulsed laser radiation, which melts a portion of the overburden, but does not melt the germanium containing material in the recesses. The germanium containing material in the recesses is typically annealed, at least in part, by the thermal treatment. The overburden is then removed.

The thermal treatment may be performed using a pulsed laser system that delivers laser pulses having a duration from about 1 nsec to about 1 msec, for example less than about 50 nsec. Following the thermal treatment, the overburden may be removed by planarizing or etching.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a schematic view of an apparatus that may be used to practice portions of the method of FIG. 1.

DETAILED DESCRIPTION

Figure 1:
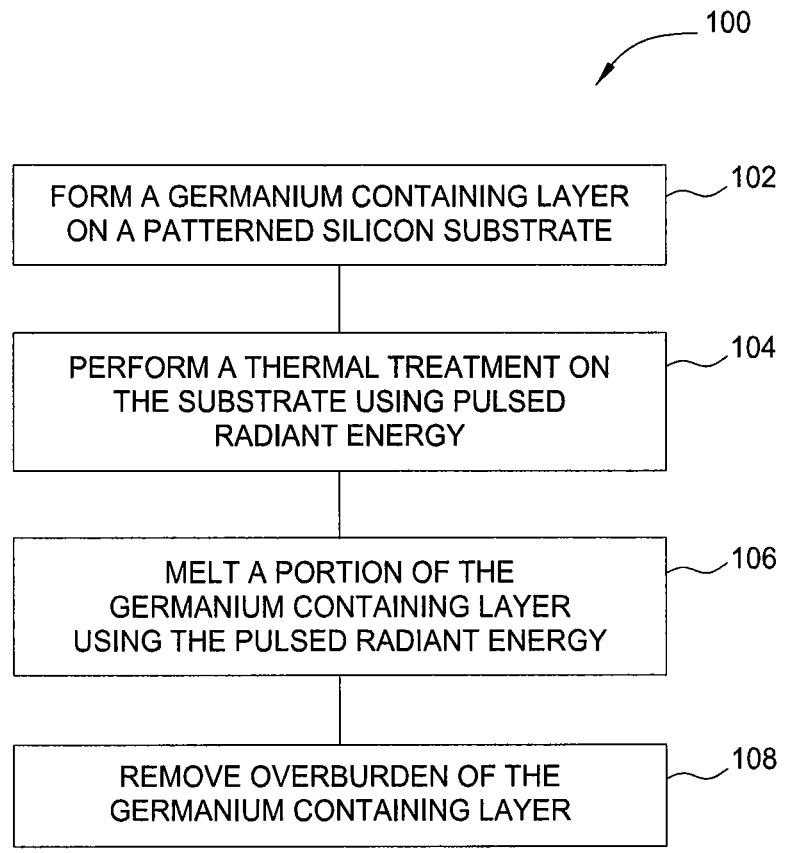
FIG. 1 is a flow diagram summarizing a method according to one embodiment.

FIG. 1 is a flow diagram summarizing a method 100 according to one embodiment. A silicon substrate is patterned according to any convenient patterning process, and the patterned silicon substrate is provided to a deposition chamber. The deposition chamber may be a thermal or plasma deposition chamber, such as an epitaxial deposition chamber.

The pattern in the silicon substrate consists of recesses formed in a substantially flat silicon surface. The silicon surface may have a mask layer formed thereon, for example a silicon nitride layer. The recesses typically have an aspect ratio, which is a ratio of depth to width, of at least 1:1, and may as high as 40:1. Typically the recesses have aspect ratio of between about 1:1 and about 10:1, such as between about 1.5:1 and about 5:1, for example about 3:1. The walls of the recesses are typically substantially vertical, but may deviate from vertical to some extent. The step coverage of the average recess, or ratio of recess width at the top of an average recess to recess width at the bottom of the recess, may be between about 95% and about 120%, such as between about 97% and about 110%, for example about 100%.

At 102, a germanium containing layer is deposited, formed, or grown on the substrate. The substrate is disposed in a processing chamber for depositing or growing a material layer. As noted above, such a chamber may be a thermal or plasma CVD chamber. One example of such a chamber is the Centura® RP Epi chamber available from Applied Materials, Inc., of Santa Clara, Calif. Thermal or plasma CVD chambers from other manufacturers may also be used.

The layer may be formed using a process that operates in a reaction rate limited regime at a low temperature between about 300° C. and about 500° C., such as between about 350° C. and about 450° C., for example about 375° C., and a high Ge source partial pressure. The germanium precursor is a compound such as germane, $GeH_4$, digermane, $Ge_2H_6$, or higher order germanes or germane oligomers, which may be provided with a carrier gas or a dilution gas in a germanium precursor mixture. The carrier gas or dilution gas is typically an inert material such as argon or helium. Hydrogen and nitrogen may also be used. The germanium precursor may be provided at any concentration in the germanium precursor mixture, and the ratio is typically selected to provide a desired gas flow rate through the processing chamber. For a 300 mm wafer substrate, the flow rate of germanium precursor mixture is typically between about 0.1 and 2.0 sLm, of which the germanium precursor from 20% to 80%, for example 50%, by volume.

A selectivity control reagent, such as HCl, HF, or HBr, is typically provided to the processing chamber during film formation. The selectivity control agent promotes selective film formation in the recesses of the patterned surface. The selectivity control reagent is typically provided at a volumetric flow rate, and a ratio of the volumetric flow rate of the selectivity enhancing reagent to the volumetric flow rate of the germanium precursor is between about 0.0 and 0.5, such as between about 0.02 and about 0.06, for example about 0.04. The selectivity control reagent is typically provided to the processing chamber through a different pathway from the germanium precursor to prevent any premature or side reactions. The selectivity control reagent may also be provided with a dilution or carrier gas.

A dopant precursor may also be included with the germanium precursor in an amount selected to provide a desired dopant concentration in the film formed on the patterned silicon surface. Dopants such as borane, phosphine, or arsine, and/or dimers, oligomers, and derivatives, such as halides, may be provided.

The germanium containing layer is typically deposited in excess. An average overburden between about 50% and about 400% is typically used. Overburden is a depth of the deposited film beyond that needed to fill the recesses in the substrate surface. The percentage of overburden is the depth of the film formed on the field region of the substrate divided by the depth of the recesses. Thus, if the recesses are 50 nm deep, and after filling the recesses a film of depth 50 nm is deposited on the field region, the overburden is 100%.

At 104, the germanium containing film is subjected to a thermal treatment. The thermal treatment is performed by exposing the germanium containing layer to pulses of radiant energy from an intense radiant energy source. The pulses of radiation typically have a duration between about 1 nsec and about 1 msec, such as between about 10 nsec and 100 nsec, for example about 50 nsec. The pulses may be produced from one or more lasers or intense emitters such as LED's. Radiation emitted by the energy source is typically shaped, focused, and tailored to produce a radiation field that has a desired power profile and uniformity, a desired duration, and a desired temporal shape. The energy delivered in each pulse is typically between about $0.1 \text{ J/cm}^2$ and $1.0 \text{ J/cm}^2$, such as between about $0.1 \text{ J/cm}^2$ and about $0.5 \text{ J/cm}^2$, for example about $0.2 \text{ J/cm}^2$. A shaped energy field is produced and directed to a target zone of the substrate to anneal the target zone. The substrate and/or the energy source is shifted to target a second target zone for thermal treatment. The second target zone may be spaced apart from the first target zone to leave a border zone having a width selected to provide a buffer between two adjacent target zones. The buffer prevents thermal stresses in the second target zone from disrupting the result of annealing the first target zone. The border zone typically has a width between about 1 µm and about 100 µm, such as between about 10 µm and about 50 µm, for example about 20 µm.

A surface of the germanium containing layer is melted by exposure to the radiant energy at 106. While the surface of the germanium containing layer is melted by the radiant energy, the portion of the germanium containing layer in the recesses is annealed without melting. The surface of the germanium containing layer is typically melted to a depth between about 1 nm and about 50 nm, but in no case is the entire overburden of the germanium containing layer melted. Typically, less than about 80% of the overburden is melted from the surface of the germanium containing layer to a transition region near the field region of the substrate. The transition region of the substrate conducts heat from the melted region into the recesses to anneal the entire thickness of the germanium containing layer.

The surface of the germanium containing layer is partially or fully reflowed during the anneal process. The surface of the germanium containing layer is smoothed in the target zone during the anneal process. Typically, one or more pulses of radiant energy are delivered to each target zone. Each pulse may have enough energy to melt a portion of the surface, or each pulse may have energy less than an amount needed to melt a portion of the surface. The pulses may have the same intensity or different intensity. A first pulse may be delivered with energy less than an amount needed to melt a portion of the surface, and a second pulse may be delivered thereafter that has energy that melts a portion of the surface. A rest duration between pulses is selected to provide time for heat to dissipate in the target zone, so that melting does not progress into the recesses.

After annealing the surface of the germanium containing layer, the overburden of the germanium containing layer may be removed at 108. The overburden may be removed by any suitable material removal process, such as etching or planarization. A CMP process may be performed on the substrate until the field region of the silicon substrate is exposed. Alternately, the germanium containing layer may be etched until the silicon field region is exposed. Etching of the germanium containing layer may be performed by flowing a halogen containing gas, for example a halogen gas such as $Cl_2$ or $Br_2$, or a halide gas such as HCl or HBr, optionally with a carrier or dilution gas as described above, into a chamber containing the substrate. The halogen containing gas may be activated thermally or electrically. If activated thermally, the substrate is typically heated to a temperature between about 500° C. and 1,000° C. If activated electrically, an RF energy may be coupled into the gas. In a plasma embodiment, the substrate temperature may be between about 0° C. and about 400° C.

FIG. 2 is a plan view of a system 200 for laser processing of substrates. The system 200 comprises an energy module 202 that has a plurality of pulsed laser sources producing a plurality of pulsed laser pulses, a pulse control module 204 that combines individual pulsed laser pulses into combination pulsed laser pulses, and that controls intensity, frequency characteristics, and polarity characteristics of the combination pulsed laser pulses, a pulse shaping module 106 that adjusts the temporal profile of the pulses of the combined pulsed laser pulses, a homogenizer 108 that adjusts the spatial energy distribution of the pulses, overlapping the combination pulsed laser pulses into a single uniform energy field, an aperture member 216 that removes residual edge non-uniformity from the energy field, and an alignment module 218 that allows precision alignment of the laser energy field with a substrate disposed on a substrate support 210. A controller 212 is coupled to the energy module 202 to control production of the laser pulses, the pulse control module 204 to control pulse characteristics, and the substrate support 210 to control movement of the substrate with respect to the energy field. An enclosure 214 typically encloses the operative components of the system 200.

The lasers may be any type of laser capable of forming short pulses, for example duration less than about 100 nsec., of high power laser radiation. Typically, high modality lasers having over 500 spatial modes with $M^2$ greater than about 30 are used. Solid state lasers such as Nd:YAG, Nd:glass, titanium-sapphire, or other rare earth doped crystal lasers are frequently used, but gas lasers such as excimer lasers, for example $XeCl_2$, ArF, or KrF lasers, may be used. The lasers may be switched, for example by q-switching (passive or active), gain switching, or mode locking. A Pockels cell may also be used proximate the output of a laser to form pulses by interrupting a beam emitted by the laser. In general, lasers usable for pulsed laser processing are capable of producing pulses of laser radiation having energy content between about 100 mJ and about 10 J with duration between about 1 nsec and about 100 µsec, typically about 1 J in about 8 nsec. The lasers may have wavelength between about 200 nm and about 2,000 nm, such as between about 400 nm and about 1,000 nm, for example about 532 nm. In one embodiment, the lasers are q-switched frequency-doubled Nd:YAG lasers. The lasers may all operate at the same wavelength, or one or more of the lasers may operate at different wavelengths from the other lasers in the energy module 102. The lasers may be amplified to develop the power levels desired. In most cases, the amplification medium will be the same or similar composition to the lasing medium. Each individual laser pulse is usually amplified by itself, but in some embodiments, all laser pulses may be amplified after combining.

A typical laser pulse delivered to a substrate is a combination of multiple laser pulses. The multiple pulses are generated at controlled times and in controlled relationship to each other such that, when combined, a single pulse of laser radiation results that has a controlled temporal and spatial energy profile, with a controlled energy rise, duration, and decay, and a controlled spatial distribution of energy non-uniformity. The controller 212 may have a pulse generator, for example an electronic timer coupled to a voltage source, that is coupled to each laser, for example each switch of each laser, to control generation of pulses from each laser.

The plurality of lasers are arranged so that each laser produces pulses that emerge into the pulse control module 204, which may have one or more pulse controllers 205. The pulse controllers 205 control the intensity of each pulse and combines pulses from two lasers into a single pulse by polarizing the two pulses orthogonally and directing the two pulses to opposite surfaces of a polarizing beam splitter. The combined pulse features two orthogonally polarized pulses co-propagating along the same optical axis. The intensity of each pulse to be combined is controlled using an adjustable polarity filter.

The controller 212 may adjust an electronic timer coupled to an active q-switch of each laser to control pulse timing. Cycling the active q-switch faster makes shorter pulses, and vice versa. The controller 212 may also be configured to adjust power input to each laser.

One or more combined pulses exit the pulse control module 204 and enter the pulse shaping module 206, which has one or more pulse shapers 207. The pulse shaper 207 may feature a plurality of mirrors and beam splitters that subdivide an input pulse into sub pulses that travel different optical paths through the mirrors and splitters. The position of the mirrors may be adjusted to adjust the optical paths. The result of the optical system of mirrors and splitters in the pulse shaping module 206 is that each combined pulse is lengthened in a selective way determined by the position of the mirrors in the optical system.

Shaped pulses from the pulse shaping module 206 are routed into a homogenizer 208. The homogenizer 208 typically combines two or more microlens arrays with one or more lenses to improve the uniformity of the power distribution of the energy field emerging from the homogenizer 208. Energy from the homogenizer 208 is typically arranged in a pattern, such as a square or rectangular shape, that approximately fits an area to be annealed on the surface of a substrate. The processing and rearranging applied to the energy results in an energy field having intensity that varies from an average value by no more than about 15%, such as less than about 12%, for example less than about 8%. Near the edges of the energy field, however, more significant non-uniformities may persist due to various boundary conditions throughout the apparatus. These edge non-uniformities may be removed using an aperture member 216. The aperture member 216 is typically an opaque object having an opening through which the energy may pass in cross-section shaped like the opening.

Aperture members may vary in size. An aperture member having a smaller aperture may be positioned proximate an aperture member having a larger aperture to reduce the size of the transmitted energy field. The smaller aperture member may be removed again to utilize the larger aperture. Multiple aperture members having different sizes may be provided to allow changing the size of the energy field to anneal areas having different sizes. Alternately, a single aperture member may have a variable aperture size. Two rectangular channels may be formed in a transparent housing, and two pairs of opaque or reflective actuated half-plates disposed in the rectangular channels such that a pair of half-plates meets in a central portion of the transparent housing. The pairs of half-plates may be oriented to move along orthogonal axes so that a rectangular aperture of variable size may be formed by moving each pair of half-plates closer together or further apart within the rectangular channels.

The aperture members may magnify or reduce the image of the light passing through the aperture in any desired way. The aperture members may have magnification factor of 1:1, which is essentially no magnification, or may reduce the image in size by a factor of between about 1.1:1 and about 5:1, for example, about 2:1 or about 4:1. Reduction in size may be useful for some embodiments because the edges of the imaged energy field may be sharpened by the size reduction. Magnification by a factor between about 1:1.1 and about 1:5, for example about 1:2, may be useful in some embodiments to improve efficiency and throughput by increasing coverage area of the imaged energy field.

An imaging optic 218 receives the shaped, smoothed, and truncated energy field from the aperture member 216 and projects it onto a substrate disposed on a work surface 220 of the substrate support 210.

Thermal energy is coupled into a substrate disposed on a work surface of a substrate support using methods disclosed herein. The thermal energy is developed by applying electromagnetic energy at an average intensity between about 0.2 J/cm$^2$ and about 1.0 J/cm$^2$ to successive portions of the surface of a substrate in short pulses of duration between about 1 nsec and about 100 nsec, such as between about 5 nsec and about 50 nsec, for example about 10 nsec. A plurality of such pulses may be applied to each portion of the substrate, with a duration between the pulses between about 500 nsec and about 1 msec, such as between about 1 μsec and about 500 μsec, for example about 100 μsec, to allow complete dissipation of the thermal energy through the substrate before the next pulse arrives. The energy field typically covers an area of between about 0.1 cm$^2$ and about 10.0 cm$^2$, for example about 6 cm$^2$, resulting in a power delivery of between about 0.2 MW and about 10 GW with each pulse. In most applications, the power delivered with each pulse will be between about 10 MW and about 500 MW. The power density delivered is typically between about 2 MW/cm$^2$ and about 1 GW/cm$^2$, such as between about 5 MW/cm$^2$ and about 100 MW/cm$^2$, for example about 10 MW/cm$^2$. The energy field applied in each pulse has spatial standard deviation of intensity that is no more than about 4%, such as less than about 3.5%, for example less than about 3.0%, of the average intensity.

An exemplary apparatus that may be used to perform the thermal imaging is described in commonly owned United States Patent Application Serial No. 2012/0325794, published on Dec. 27, 2012, which is incorporated herein by reference.

While the foregoing is directed to embodiments of the present invention, other and further embodiments of the invention may be devised without departing from the basic scope thereof, and the scope thereof is determined by the claims that follow.

The invention claimed is:

1. A method of processing a patterned silicon substrate, comprising:

depositing a germanium containing material in recesses of the patterned silicon substrate;

depositing an overburden of the germanium containing material of at least about 50% on the substrate; and directing one or more laser pulses to the germanium containing material, wherein each laser pulse has energy sufficient to melt a portion of the overburden;

reflowing a surface of the germanium containing material to form a substantially flat surface; and removing the overburden.

2. The method of claim 1, wherein each of the one or more laser pulses has a duration less than about 50 nsec.

3. The method of claim 2, wherein each of the laser pulses is formed from the radiation emitted by more than one laser.

4. The method of claim 3, wherein no more than about 80% of the overburden is melted.

5. The method of claim 4, wherein the overburden is removed by planarizing.

6. The method of claim 4, wherein the overburden is removed by etching.

7. The method of claim 3, wherein each pulse has a tailored temporal profile.

8. The method of claim 7, wherein no more than about 80% of the overburden is melted.

9. The method of claim 8, wherein the overburden is removed by planarizing.

10. The method of claim 8, wherein the overburden is removed by etching.

11. A method of processing a patterned silicon substrate comprising recesses, comprising:

growing a doped germanium material in the recesses by an epitaxial process;

growing a film of the doped germanium material on the substrate to form an overburden of at least about 50%;

reflowing portions of the doped germanium film by exposing the portions to pulsed laser energy; and removing the overburden.

12. The method of claim 11, wherein the pulsed laser energy is formed by combining pulses from two or more lasers.

13. The method of claim 12, wherein each pulse of the pulsed laser energy has a duration less than about 50 nsec.

14. The method of claim 13, wherein each pulse delivers energy between about 0.1 J/cm$^2$ and about 0.5 J/cm$^2$.

15. The method of claim 14, wherein the overburden is removed by planarization.

\* \* \* \* \*